(12) United States Patent
Taguchi

(10) Patent No.: US 6,529,536 B1
(45) Date of Patent: Mar. 4, 2003

(54) LASER DRIVE CIRCUIT AND RECORDING APPARATUS USING THE SAME

(75) Inventor: Toyoki Taguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 155 days.

(21) Appl. No.: 09/640,763

(22) Filed: Aug. 18, 2000

(30) Foreign Application Priority Data

Aug. 19, 1999 (JP) .......................................... 11-232827

(51) Int. Cl.[7] ................................................ H01S 3/00
(52) U.S. Cl. ................................... 372/38.07; 372/38.08
(58) Field of Search ........................... 372/38.02, 38.03, 372/38.08, 38.07, 43, 46

(56) References Cited

U.S. PATENT DOCUMENTS

| | | | | |
|---|---|---|---|---|
| 4,868,482 A | * | 9/1989 | O'Shaughnessy et al. | 323/313 |
| 5,317,206 A | * | 5/1994 | Hanibuchi et al. | 304/443 |
| 5,514,989 A | * | 5/1996 | Soto et al. | 372/109 |
| 5,796,767 A | * | 8/1998 | Aizawa | 372/38 |
| 5,859,862 A | | 1/1999 | Hikasa et al. | |

* cited by examiner

Primary Examiner—Paul Ip
Assistant Examiner—Tuan M Nguyen
(74) Attorney, Agent, or Firm—Oblon, Spivak, McClelland, Maier & Neustadt, P.C.

(57) ABSTRACT

In a laser drive circuit for use in an optical disc recording and reproducing apparatus, a P-channel MOS transistor acting as a drive current source generates a drive current $I_{LD}$ depending on a setting current Ic. A P-channel MOS transistor acting as a current switch supplies the drive current $I_{LD}$ to a semiconductor laser, in response to a drive pulse signal CP. An OP amplifier controls a setting current Ic depending on a monitor current Im and a setting voltage Vc. A capacitor removes noise generated by the transistor acting as a current switch and superposed on the drive current $I_{LD}$.

22 Claims, 9 Drawing Sheets

LASER DRIVE CIRCUIT AND RECORDING APPARATUS USING THE SAME

CROSS-REFERENCE TO RELATED APPLICATIONS

This application is based upon and claims the benefit of priority from the prior Japanese Patent Application No. 11-232827, filed Aug. 19, 1999, the entire contents of which are incorporated herein by reference.

BACKGROUND OF THE INVENTION

The present invention relates to a laser drive circuit and a recording apparatus using this laser drive circuit. More specifically, the present invention relates to an optical disc recording and reproducing apparatus for compact discs (CD-R (Recordable)/CD-RW (Read Write)), digital versatile discs (DVD-RAM (Random Access read write Memory)), magnet-optical (MO) discs, or other discs to which data can be written, as well as a laser drive circuit applied to this apparatus.

A known laser drive circuit applied to an apparatus of this kind is described, for example, in Japanese Patent Publication No. 8-3904 (hereafter referred to as a "conventional example").

FIG. 1 shows the laser drive circuit described in the conventional example. The laser drive circuit 100 comprises an operation amplifier (hereafter referred to as an "OP amplifier") 101, an inverter circuit 102 having complementary output ends, PNP transistors 103, 104, 105, a resistor 106, a power terminal 110 to which a power supply Vcc is supplied, an input end 111 to which a setting voltage Vc is supplied for setting a drive current $I_{LD}$, a terminal 112 to which a drive pulse signal CP for recording is supplied, and a terminal 113 having a semiconductor laser 114 connected thereto.

The setting voltage Vc supplied to the input end 111 is supplied to a non-inverted input end of the OP amplifier 101. Then, a base voltage of the PNP transistor 103 is controlled depending on the setting voltage Vc. A constant current Id output from a collector of the transistor 103 is supplied to an emitter of each of the PNP transistors 104, 105, which constitute a current switch.

In addition, the drive pulse signal CP supplied to the terminal 112 is supplied to the inverter circuit 102. Complementary output signals from the inverter circuit 102 are supplied to corresponding bases of the transistors 104 and 105. When the drive pulse signal CP is at a high level, an output signal from the inverter 102 turns on the transistor 105. This causes the constant current Id to be supplied to the semiconductor laser 114 through the terminal 113. On the other hand, when the drive pulse signal CP is at a low level, the output signal from the inverter circuit 102 turns on the transistor 104. This causes the constant current Id to flow to the ground.

In the laser drive circuit 100 in the above described conventional example, however, the constant current Id flows to the transistor 104 or 105 whether the drive pulse signal CP is at the high or low level. Normally, a drive current of 100 mA or higher is required for the semiconductor laser 114 during recording. The laser drive circuit 100 constantly consumes a current of 100 mA or higher. As a result, this circuit disadvantageously consumes a high current.

In particular, if the laser drive circuit 100 is located near the semiconductor laser 114, heat generated by the laser drive circuit 100 rises an operating temperature of the semiconductor laser 114. This results in a further increase in the drive current for the semiconductor laser 114, which is a serious problem.

On the other hand, optical disc recording and reproducing apparatuses are required to record data at a high speed. The laser drive circuit 100 in the conventional example, however, is constructed using the PNP transistors 103, 104, and 105. Accordingly, this circuit cannot essentially meet this requirement easily.

BRIEF SUMMARY OF THE INVENTION

The object of the present invention is to provide a laser drive circuit that consumes less current and that can still operate at a high speed, as well as a recording apparatus using this laser drive circuit.

To attain the above object, according to a first aspect of the present invention, there is provided a laser drive circuit comprising a drive current source comprising a MOS transistor to generate a drive current depending on a setting current, a switch comprising a MOS transistor to supply the drive current supplied by the drive current source to a semiconductor laser, in response to a drive signal, and a stabilizing circuit connected to the drive current source to stabilize the drive current when the switch is turned on or off.

According to a second aspect of the present invention, there is provided a laser drive circuit comprising a drive current source comprising a MOS transistor to generate a drive current depending on a setting current, a control circuit configured to detect the setting current to control it depending on a setting voltage, and a switch comprising a MOS transistor to supply the drive current supplied by the drive current source to a semiconductor laser, in response to a drive signal.

According to a third aspect of the present invention, there is provided a recording apparatus comprising a drive circuit configured to generate a drive current for recording depending on a setting voltage for recording, and a semiconductor laser to which the drive current from the drive circuit is supplied, the drive circuit comprising a drive current source comprising a MOS transistor to generate the drive current depending on a setting current corresponding to the setting voltage, and a switch comprising a MOS transistor to supply the drive current supplied by the drive current source to the semiconductor laser, in response to a drive signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

First Embodiment

Figure 2:
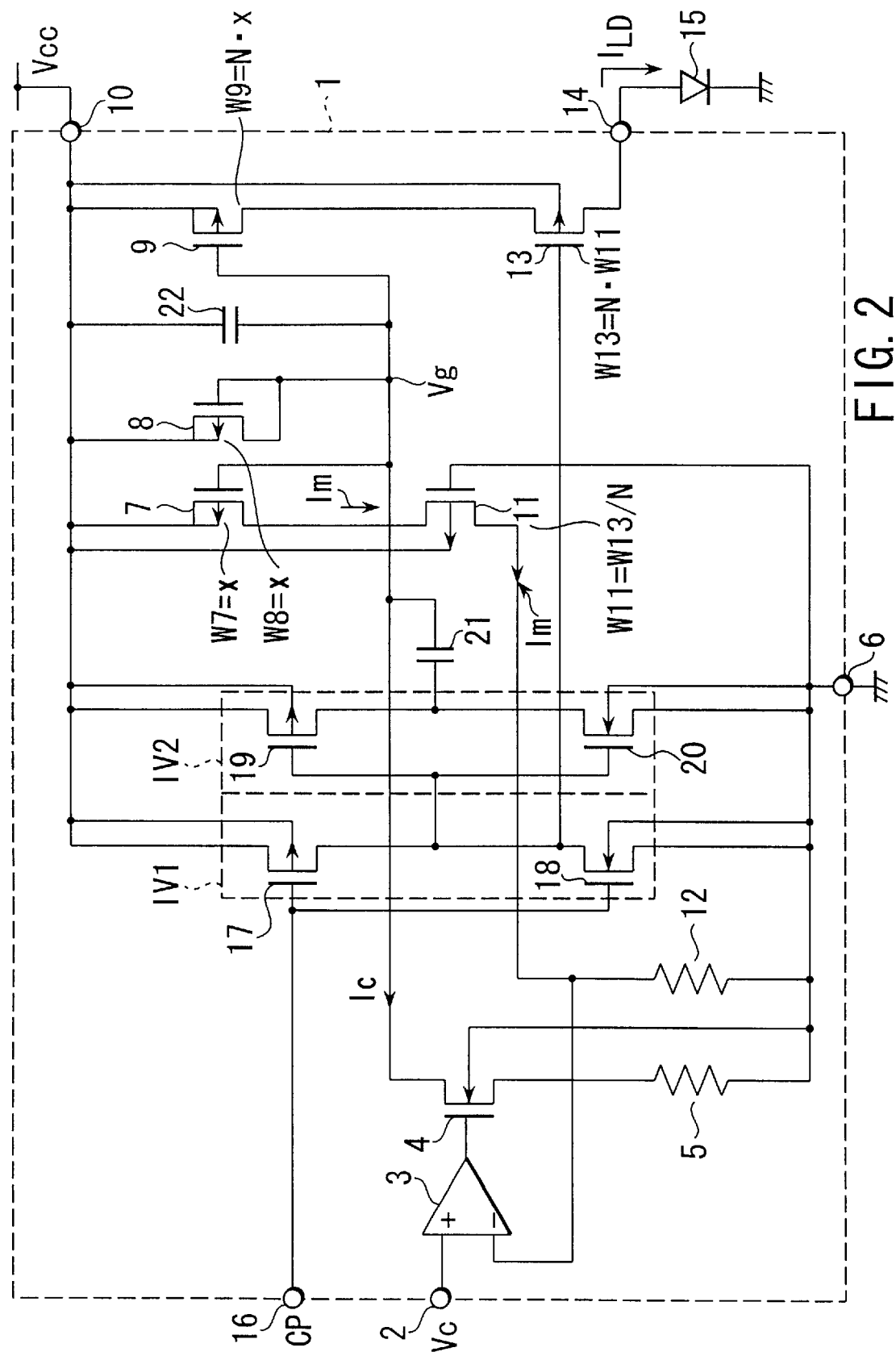
FIG. 2 is a circuit diagram showing an example of a laser drive circuit according to a first embodiment of the present invention.

FIG. 2 shows the configuration of a laser drive circuit according to a first embodiment of the present invention. In the laser drive circuit 1, a setting voltage Vc for setting a drive current $I_{LD}$ is supplied to a terminal 2. A terminal 16 is supplied with a drive pulse signal CP. In addition, the terminal 2 is connected to a non-inverted input end of an OP amplifier (a control circuit) 3. An output end of the OP amplifier 3 is connected to a gate of an N-channel MOS transistor 4. A source of the transistor 4 is connected to a grounded terminal 6 through a resistor 5. Additionally, the terminal 6 has a substrate of the transistor 4 also connected thereto.

A drain of the transistor 4 is connected to a gate of each of P-channel MOS transistors 7, 8, and 9. Sources and substrates of the transistors 7, 8, and 9 are connected to a terminal 10 for which a power supply Vcc is provided. In addition, a drain of the transistor 7 is connected to a source of a P-channel MOS transistor 11. A substrate of the transistor 11 is connected to the terminal 10. A gate of the transistor 11 is connected to the terminal 6. Further, a drain of the transistor 11 is connected to an inverted input end of the OP amplifier 3 and to the terminal 6 through a resistor 12.

In addition, a drain of the transistor 8 is connected to the gate thereof. Further, the drain of the transistor 9 acting as a drive current source is connected to a source of a P-channel MOS transistor 13 acting as a current switch. A substrate of the transistor 13 is connected to the terminal 10. Additionally, a drain of the transistor 13 is connected to a terminal 14. A semiconductor laser 15 is connected between the terminal 14 and the ground.

On the other hand, the terminal 16 has gates of a P-channel MOS transistor 17 and an N-channel MOS transistor 18 connected thereto, these MOS transistors constituting an inverter circuit IV1. A source and a substrate of the transistor 17 are connected to the terminal 10. A source and a substrate of the transistor 18 are connected to the terminal 6. Drains of these transistors 17 and 18 which are connected together are connected to a gate of the transistor 13 and to a gate of each of a P-channel MOS transistor 19 and an N-channel MOS transistor 20, which constitute an inverter circuit IV2. A source and a substrate of the transistor 19 are connected to the terminal 10. A source and a substrate of the transistor 20 are connected to the terminal 6. Drains of these transistors 19 and 20 which are connected together are connected to a gate of each of the transistors 7, 8, and 9 through a capacitor 21 acting as a filter. In addition, a capacitor 22 constituting a filter is connected between the gate and source of the transistor 9.

The P-channel MOS transistors 7 and 8 have gate widths W7 and W8 each set equal to x (W7=W8=x). The gate width W9 of the P-channel MOS transistor 9 is set N times as large as those W7 and W8 of the transistors 7 and 8 (W9=N·x). In addition, the gate width W11 of the P-channel MOS transistor 11 is set equal to one-N-th of that W13 of the transistor 13 (W11=W13/N, W13=N·W11). The transistors 7, 8, 9, 11, and 13 have an equal gate length.

The operation of the laser drive circuit 1 configured as described above will be explained. The setting voltage vc is supplied to the non-inverted input end of the OP amplifier 3 through the terminal 2. An output signal from the OP amplifier 3 controls the gate of the transistor 4. Thus, a setting current Ic flowing through the drain of the transistor 4 is controlled. The setting current Ic is supplied to the gate and drain of the transistor 8. A control voltage Vg for the transistor 8 controls a gate voltage of the transistor 9. Thus, the transistor 9 generates a drive current $I_{LD}$. The gate width W9 of the transistor 9 is set N times as large as that W8 of the transistor 8, as described above. Accordingly, a high drive current $I_{LD}$ can be generated with a low setting current Ic.

The control voltage Vg for the transistor 8 is also supplied to the gate of the transistor 7. The gate widths W7 and W8 of the transistors 7 and 8 are set equal. Thus, the transistor 7 generates a monitor current Im almost equal to the setting current Ic. The monitor current Im is supplied to the source of the transistor 11. The transistor 11 has its gate grounded and is thus constantly on. As a result, the monitor current Im is feedback to the resistor 12 through the drain of the transistor 11. If the resistor 12 is assumed to have a resistance value Rm, the monitor current Im is expressed by:

$$Im=Vc/Rm\approx Ic$$

On the other hand, the gate width W11 of the P-channel MOS transistor 11 is set equal to one-N-th of that W13 of the transistor 13 as described above. Thus, a monitor current generating path comprising the transistors 7 and 8 and other components is similar to a drive output path comprising the transistor 13 and other components. As a result, the non-linearity of the drive current $I_{LD}$ with respect to the setting current Ic and a temperature characteristic of the drive current $I_{LD}$ are reflected in the monitor current Im. Therefore, the drive current $I_{LD}$ is corrected by the OP amplifier 3 to be constantly proportional to the setting voltage Vc.

Additionally, the drive pulse signal CP supplied to the terminal 16 is supplied to the input end of the inverter circuit IV1 comprising the transistors 17 and 18. The drive pulse signal CP having its level inverted by the inverter circuit IV1 is supplied to the gate of the transistor 13. Thus, the transistor 13 is turned on when the drive pulse signal CP is at the high level. Consequently, the drive current $I_{LD}$ generated by the transistor 9 is supplied to the semiconductor laser 15. Alternatively, the transistor 13 is turned off when the drive pulse signal CP is at the low level. This cuts off the supply of the drive current $I_{LD}$ to the semiconductor laser 15. Thus, the drive current $I_{LD}$ generated by the transistor 9 is eliminated to reduce current consumption.

When the transistor 13 is turned on or off, a high gate current (a back gate current) is supplied to a back gate of the transistor 9 upon this switching. Consequently, a large noise occurs in the control voltage Vg to superpose a large noise component on the drive current $I_{LD}$. The capacitors 21 and 22 function as stabilizing circuits for preventing such noise to stabilize the drive current $I_{LD}$. That is, the capacitor 21 generates a correction current (a correction pulse) from an output signal from the inverter circuit IV2 to supply it to the gate of the transistor 9. Then, the back gate current generated in the transistor 9 upon the switching is canceled to prevent an unwanted noise. The combination of the capacitors 22 and 21 is particularly effective in removing a possible large noise in the control voltage vg.

Figure 3:
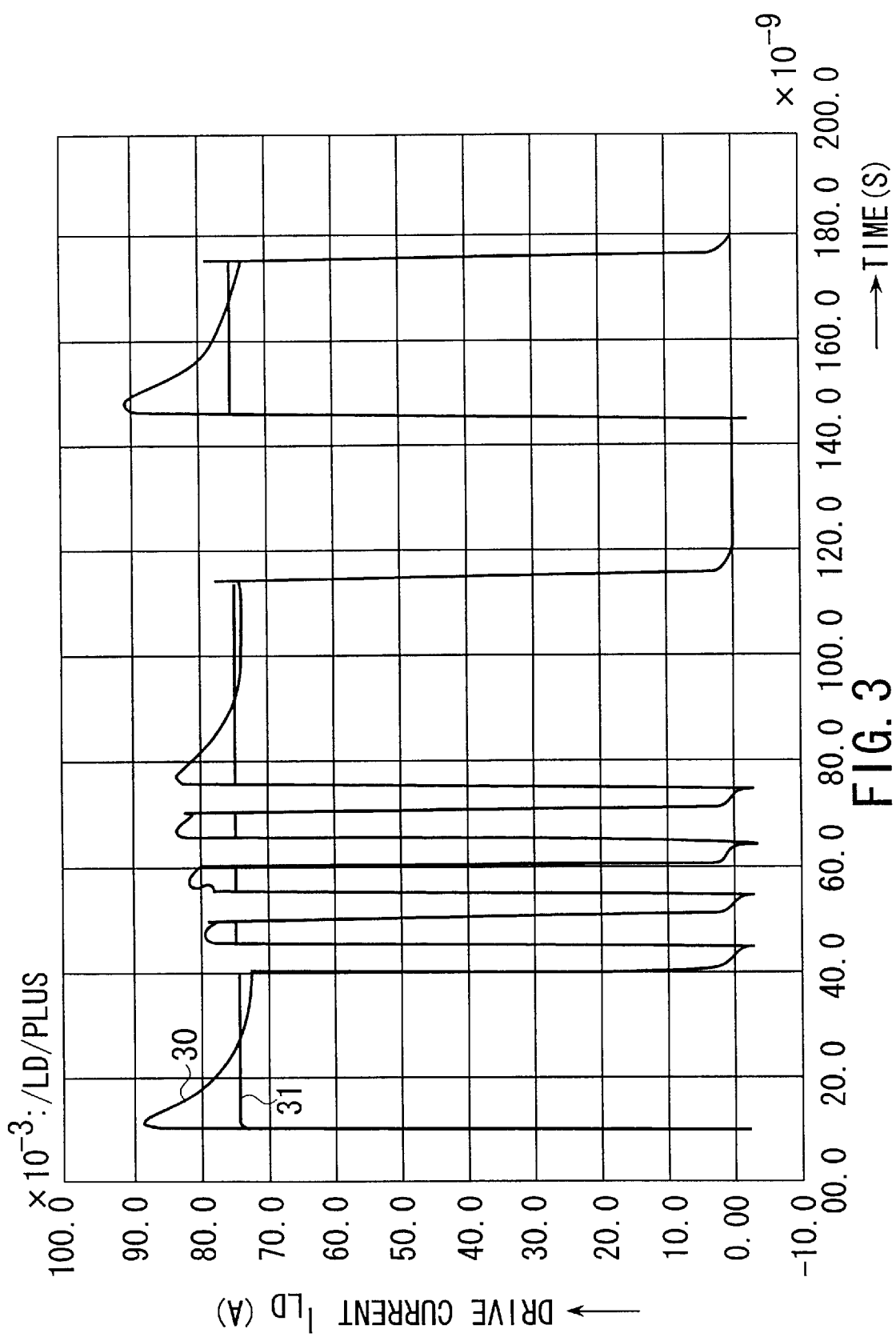
FIG. 3 is a characteristic diagram showing a noise characteristic of a drive current in the circuit in FIG. 2.

FIG. 3 shows results of simulation for the drive current $I_{LD}$ depending on the presence of the capacitor 21. In this figure, a waveform 30 corresponds to a case where the capacitor 21 is absent. This waveform 30 indicates that noise originating from an undershoot and a large overshoot that may occur when the transistor 13 is switched is superposed on the drive current $I_{LD}$. On the contrary, a waveform 31 corresponds to a case where the capacitor 21 is present. This waveform 31 indicates that almost no noise occurs when the transistor 13 is switched and that pulse responses are very fast.

Figure 4:
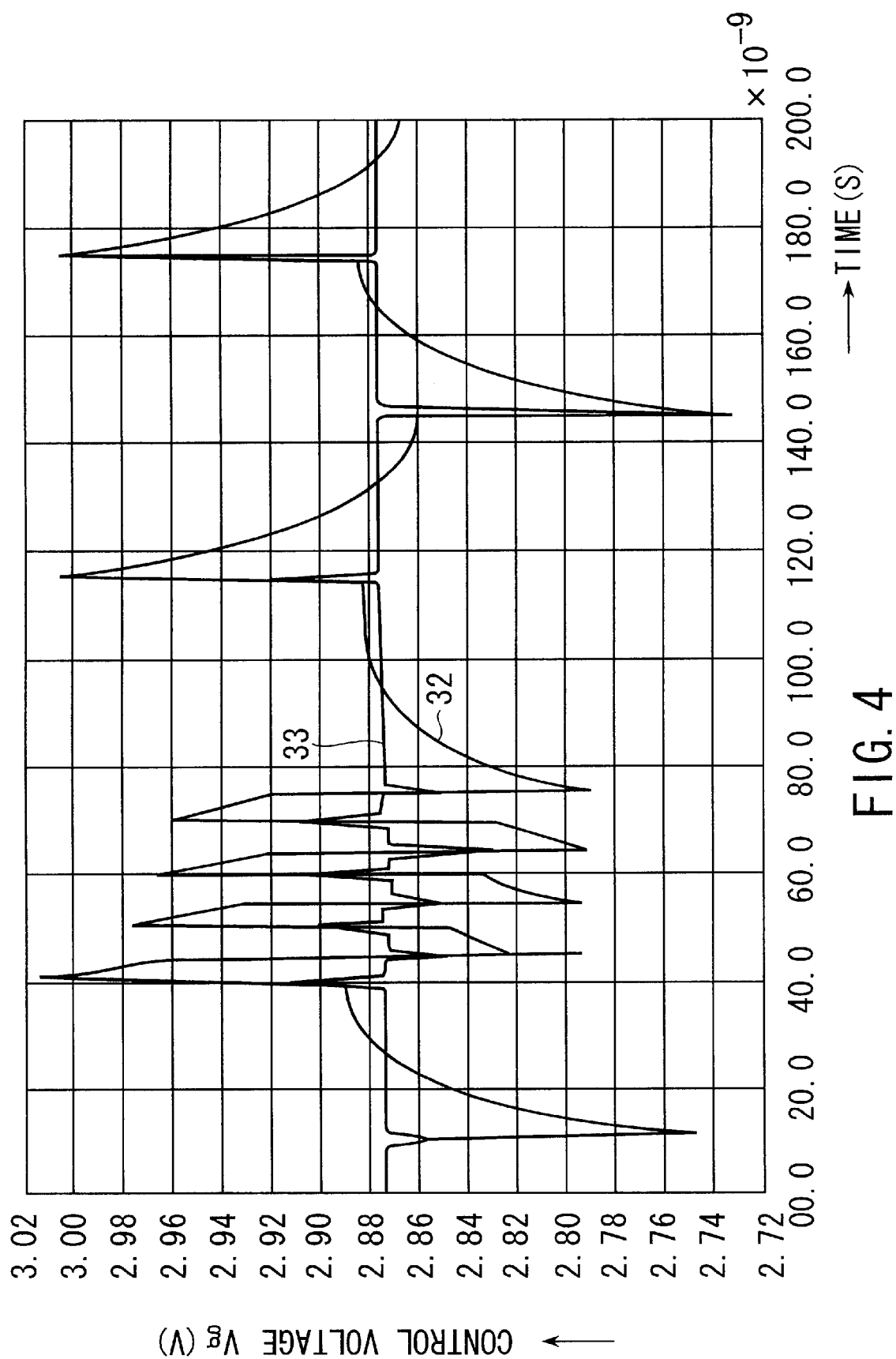
FIG. 4 is a characteristic diagram showing a noise characteristic of a control voltage in the circuit in FIG. 2.

FIG. 4 shows results of simulation for the control voltage vg depending on the presence of the capacitor 21. In this figure, a waveform 32 corresponds to a case where the capacitor 21 is absent. This waveform 32 indicates that noise that may occur when the transistor 13 is switched is superposed on the control voltage Vg. This noise may degrade the waveform of the drive current $I_{LD}$. On the contrary, a waveform 33 corresponds to a case where the capacitor 21 is present. This waveform 33 indicates that almost no noise occurs when the transistor 13 is switched and that the control voltage Vg has a relatively flat waveform. Consequently, the waveform can be significantly prevented from being degraded. Although not shown, the use of the capacitor 22 further smoothes the waveform 33 to substantially restrain noise.

According to the above described first embodiment, the transistor 9 acting as the drive current source and the transistor 13 acting as th e current switch are configured using only MOS transistors. In addition, the drive current $I_{LD}$ is generated and supplied to the semiconductor laser 15 only when the drive pulse signal CP is at the high level (the drive current $I_{LD}$ is not generated when the drive pulse signal CP is at the low level). Accordingly, the current consumption can be substantially reduced to sharply diminish the amount of heat generated by the transistors 9 and 13.

Figure 1:
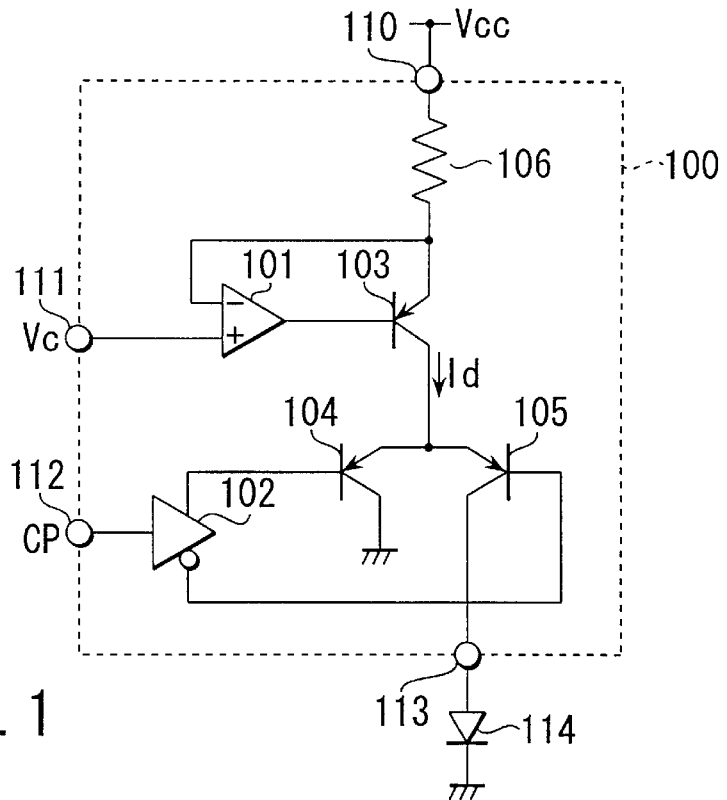
FIG. 1 is a circuit diagram of a laser drive circuit showing a conventional technique and its problems.

Additionally, the MOS transistors enables faster operations than the conventional circuit comprising bipolar transistors (see FIG. 1).

In addition, the capacitor 21 restrains the back gate current that may occur in the transistor 9 when the transistor 13 is switched. This prevents the waveform of the drive current $I_{LD}$ from being degraded by noise. In particular, by connecting the capacitor 22 between the gate and source of the transistor 9, the waveform of the control voltage Vg can be substantially prevented from being degraded by noise. As a result, the drive current $I_{LD}$ can be switched at a high speed to achieve fast pulse responses.

Further, the transistors 7 and 8 having the equal gate widths W7 and W8, respectively, generate the monitor current Im allowing the setting current Ic supplied to the gate of the transistor 9 to be accurately monitored. In addition, the monitor current Im is feedback to the resistor 12 through the transistor 11 having its gate width W11 set equal to one-N-th of that W13 of the transistor 13. The OP amplifier 3 provides such control that the voltage at the resistor 12 equals the setting voltage Vc. Therefore, an accurate setting current Ic can be generated in which the non-linearity and the temperature characteristic obtained due to the transistor 9 acting as the drive current source and the transistor 13 acting as the current switch are reflected.

Second Embodiment

Figure 5:
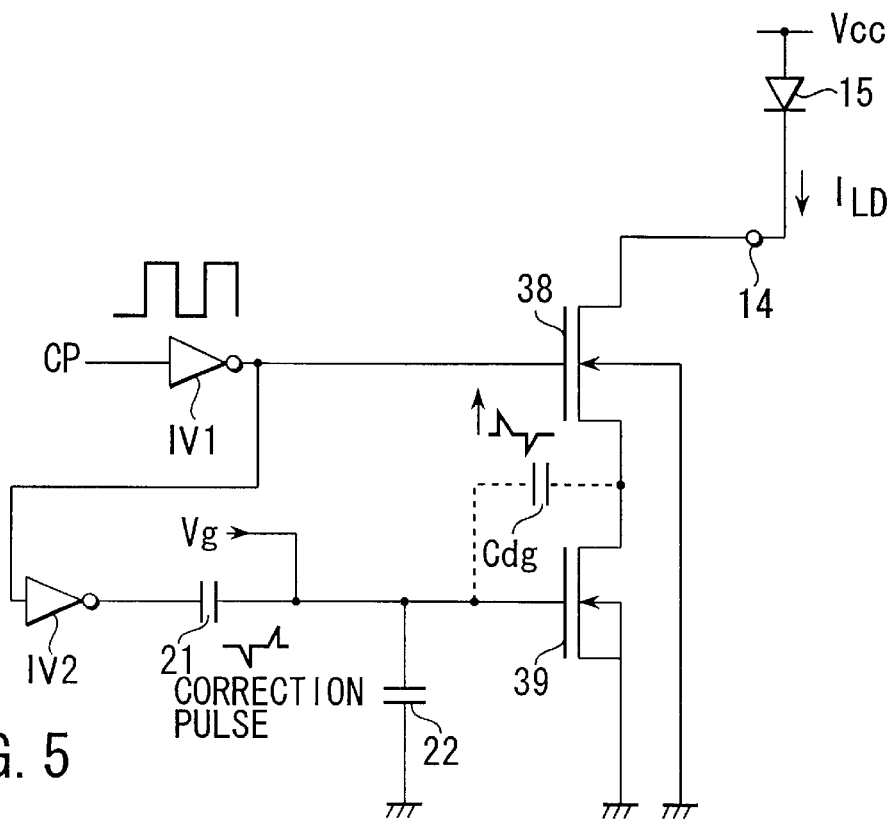
FIG. 5 is a schematic diagram of an integral part showing the configuration of a laser drive circuit according to a second embodiment of the present invention.

FIG. 5 shows a simplified view showing the configuration of a laser drive circuit according to a second embodiment of the present invention. In the laser drive circuit 1 shown in the above described FIG. 2, an anode of the semiconductor laser 15 is connected to the terminal 14, a cathode thereof is grounded, and the P-channel MOS transistors 9 and 13 are used for driving. In contrast, if the anode of the semiconductor laser 15 is connected to the power supply Vcc and the cathode thereof is connected to the terminal 14, the semiconductor laser 15 is driven by the N-channel MOS transistor.

In this case, the inverter circuit IV1 to which the drive pulse signal CP is supplied is connected to the gate of the N-channel MOS transistor 38 acting as the current switch. The source of the transistor 38 is connected to the drain of the N-channel MOS transistor 39 acting as the drive current source. In addition, the drain of the transistor 38 is connected to the terminal 14. The semiconductor laser 15 is connected between the terminal 14 and the power supply Vcc.

Further, the inverter circuit IV1 is connected to the inverter circuit IV2. The inverter circuit IV2 is connected to the gate of the transistor 39 through the capacitor 21 acting as a filter. Additionally, the capacitor 22 constituting a filter is connected between the gate and source (ground) of the transistor 39.

The substrate of the transistor 38 and the source and substrate of the transistor 39 are grounded. In addition, a capacitor Cdg in the figure is a parasitic capacity present between the gate and drain of the transistor 39.

Such a configuration is also expected to provide effects similar to those of the above described first embodiment. For example, the current consumption can be substantially reduced, while the amount of heat generated by the transistors 38 and 39 can be sharply diminished. This configuration also enables faster operations than the conventional circuit comprising bipolar transistors (see FIG. 1). Further, the drive current $I_{LD}$ can be switched at a high speed to achieve fast pulse responses.

Third Embodiment

Figure 6:
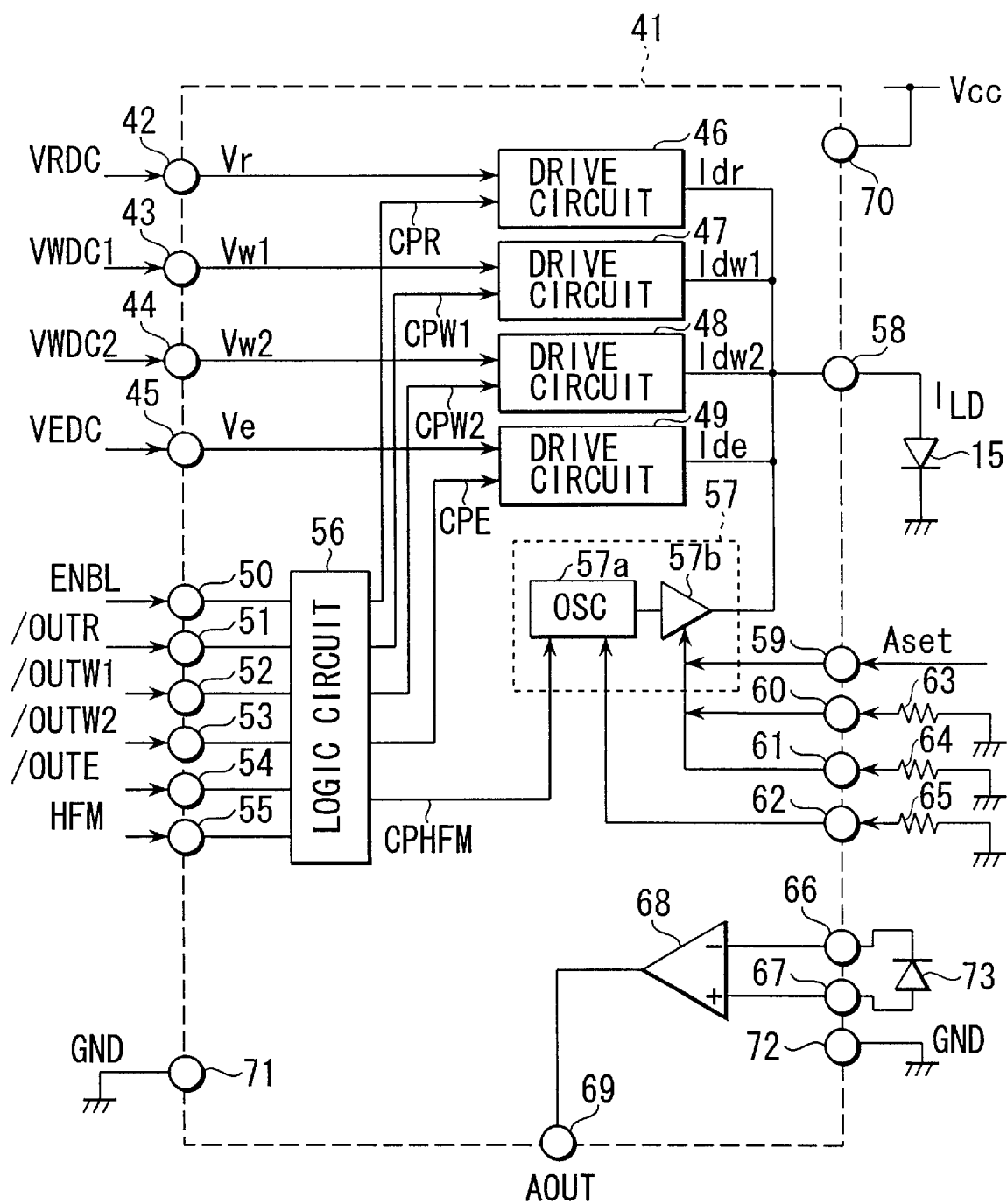
FIG. 6 is a schematic diagram showing the configuration of an optical disc recording and reproducing apparatus according to a third embodiment of the present invention.
Figure 7:
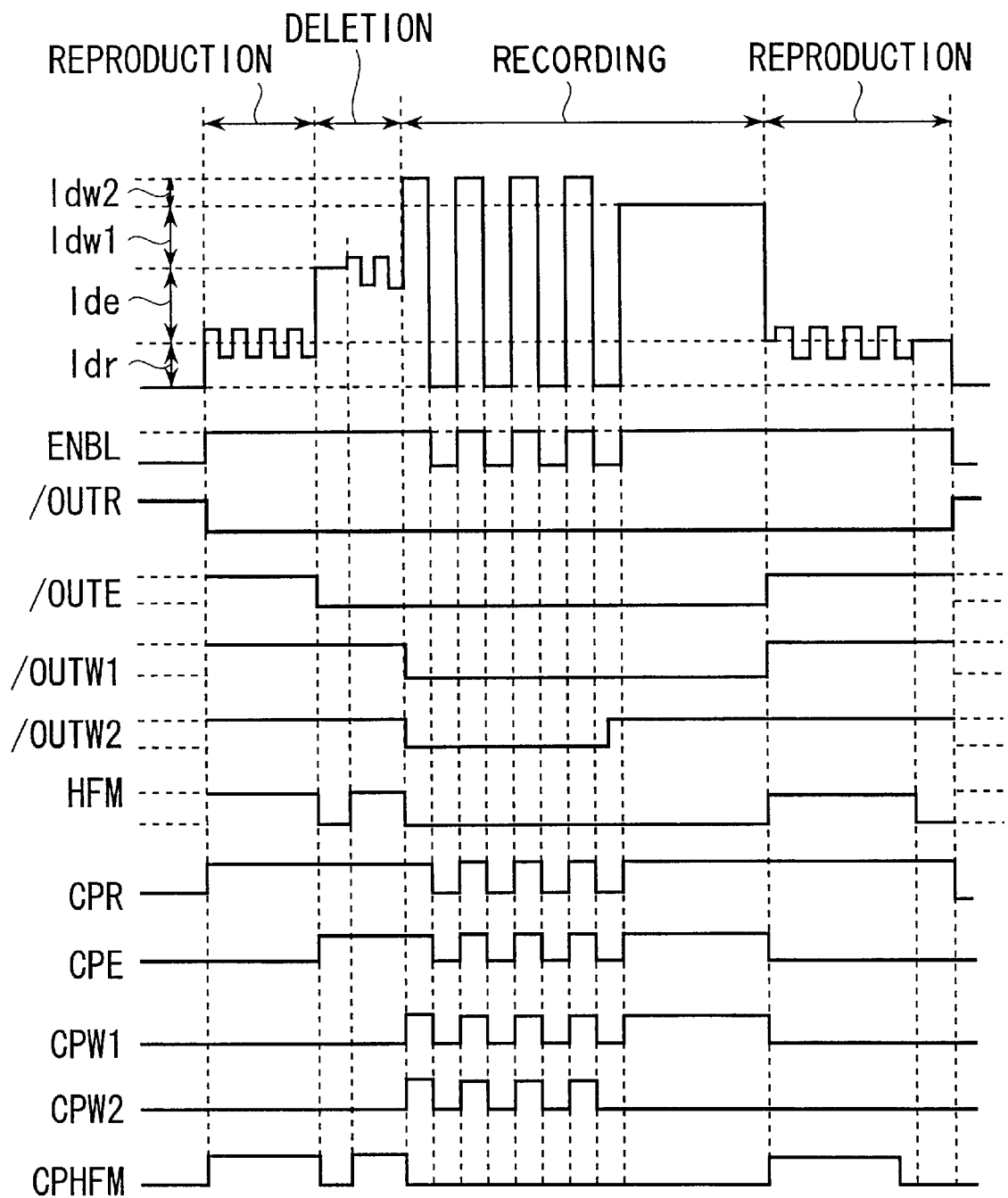
FIG. 7 is a timing chart showing an example of the operation of the apparatus in FIG. 6.

FIG. 6 relates to a third embodiment of the present invention, and shows a general configuration of an optical disc recording and reproducing apparatus using the laser drive circuit shown in FIG. 2. FIG. 7 is a timing chart showing an example of the operation of the optical disc recording and reproducing apparatus in FIG. 6.

In this optical disc recording and reproducing apparatus 41, the terminal 42 has a drive current setting voltage VRDC for reproduction supplied thereto for setting a drive current for reproduction, a terminal 43 has a drive current setting voltage VWDC1 for recording supplied thereto for setting a drive current for recording, a terminal 44 has an overdrive current setting voltage VWDC2 supplied thereto for setting an overdrive current for recording, and a terminal 45 has a drive current setting voltage VEDC for deletion supplied thereto for setting a drive current for deletion. These setting voltages VRDC, VWDC1, VWDC2, and VEDC are each supplied to one of the input ends of a corresponding one of drive circuits 46, 47, 48, and 49. The drive circuits 46, 47, 48, and 49 are configured as shown in FIG. 2, and one of the input ends of each of the drive circuits 46, 47, 48, and 49 corresponds to the terminal 2 in FIG. 2.

In addition, a terminal 50 has a control signal ENBL supplied thereto for turning on and off each drive circuits 46, 47, 48, or 49, a terminal 51 has a control signal /OUTR supplied thereto for setting turn-on or -off of the semiconductor laser 15, a terminal 52 has a recording pulse signal /OUTW1 supplied thereto, a terminal 53 has an overdrive recording pulse signal /OUTW2, a terminal 54 has a deleting pulse signal /OUTE-supplied thereto, and a terminal 55 has a control signal HFM supplied thereto for controllably turning on and off a high-frequency superposing circuit 57. These signals ENBL, /OUTR, /OUTW1, /OUTW2, /OUTE, and HFM are supplied to a logic circuit 56. The logic circuit 56 generating a reproducing drive pulse signal CPR, a drive pulse signal CPW1 for recording, a overdrive drive pulse signal CPW2 for recording, a drive pulse signal CPE for deletion, and a pulse signal CPHFM for driving the high-frequency signal superposing circuit 57. The drive pulse signals CPR, CPW1, CPW2, and CPE are supplied to the other input ends (corresponding to the terminal 16 in FIG. 2) of the drive circuits 46, 47, 48, and 49, respectively. The drive pulse signal CPHFM is supplied to an oscillator (OSC) 57a constituting the high-frequency signal superposing circuit 57.

The drive circuits 46, 47, 48, and 49 generate a reproduction current Idr, a recording current Idw1, an overdrive current Idw2 for recording, and a deletion signal Ide depending on the setting voltages VRDC, VWDC1, VWDC2, and VEDC, respectively, and in response to the drive pulse signals CPR, CPW1, CPW2, and CPE, as shown in FIG. 7. In addition, during reproduction or deletion, a high-frequency signal (a superposition current) supplied by the high-frequency signal superposing circuit 57 is superposed on the reproduction current Idr or the deletion current Ide, respectively.

As shown in FIG. 7, an operation of reproducing data recorded on an optical disc, an operation of deleting the data from the disc, and an operation of recording data on the disc, the drive current $I_{LD}$ for driving the semiconductor laser 15 is based on the reproduction current Idr. That is, for deletion, the deletion current Ide is superposed on the reproduction current Idr. For recording, the recording current Idw1 and the overdrive current Idw2 for recording are superposed on the reproduction current Idr. The drive current $I_{LD}$ thus generated is supplied to the semiconductor laser 15 through a terminal 58 (corresponding to the terminal 14 in FIG. 2).

In addition, a terminal 59 of the optical disc recording and reproducing apparatus 41 has a switching signal Aset supplied thereto for setting the amplitude of the superposition current for reproduction or deletion. The switching signal Aset is supplied to an amplifier 57b connected to the oscillator 57a. Further, terminals 60, 61, and 62 have resistors 63, 64, and 65 connected thereto, respectively. The resistor 63 adjusts an oscillation amplitude of the oscillator 57a for reproduction. The resistor 64 adjusts an oscillation amplitude of the oscillator 57a for deletion. The resistor 63 and 64 are connected to the amplifier 57b. In addition, the resistor 65 adjusts the oscillation frequency of the oscillator 57a and is connected to the oscillator 57a.

Further, the terminals 66 and 67 have a photodetector 73 connected thereto for monitoring an emission output of the semiconductor laser 15. The emission output of the semiconductor laser 15 detected by the photodetector 73 is supplied to the OP amplifier 68. The OP amplifier 68 subjects the emission output to a current/voltage conversion and outputs the obtained voltage (AOUT) from an output terminal 69.

A terminal 70 is a power terminal having the power supply Vcc connected thereto, and terminals 71 and 72 are ground (GND) terminals.

According to the above described third embodiment, the reproduction current Idr, the recording current Idw, the overdrive current Idw2 for recording, and the deletion current Ide are generated by the drive circuits 46, 47, 48, and 49 configured as shown in FIG. 2. Consequently, an optical disc recording and reproducing apparatus 41 can be realized which can substantially reduce the current consumption and which can operate at a high speed.

Moreover, noise can be prevented from occurring in the drive circuits 46, 47, 48, and 49. As a result, this embodiment has the advantage of reducing noise in the entire optical disc recording and reproducing apparatus 41.

Fourth Embodiment

Figure 8:
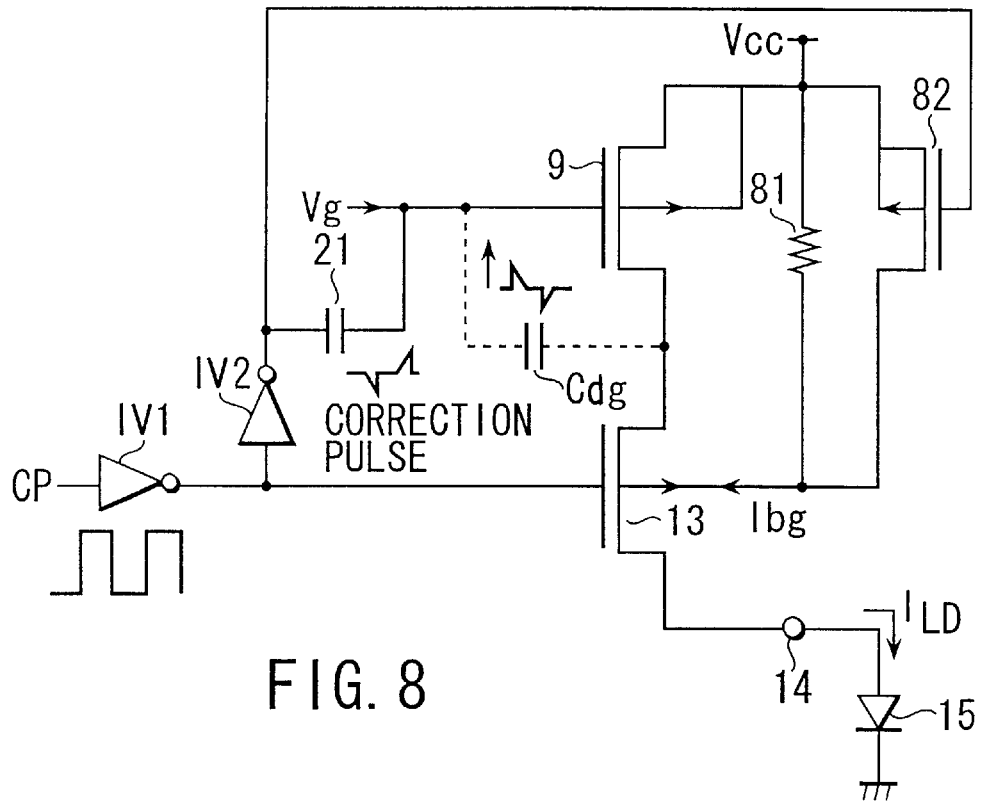
FIG. 8 is a schematic diagram showing the configuration of an integral part of a laser drive circuit according to a fourth embodiment of the present invention.

FIG. 8 is a simplified view showing the configuration of a laser drive circuit according to a fourth embodiment of the present invention.

In the laser drive circuit 1 shown in the above described FIG. 2, noise components superposed on the drive current $I_{LD}$ are removed by the capacitor 21. In this configuration, a switching current (a narrow switching noise current) that occurs in the back gate when the transistor 13 is switched can further be prevented from being added to the drive current $I_{LD}$.

In this case, as shown in FIG. 8, the inverter circuit IV1 to which the drive pulse signal CP is supplied is connected to the inverter circuit IV2 and the gate of the P-channel MOS transistor 13 acting as the current switch. The source of the transistor 13 is connected to the drain of the P-channel MOS transistor 9 acting as the drive current source. In addition, the substrate of the transistor 13 is connected to the resistor 81 and the drain of the P-channel MOS transistor 82. Further, the drain of the transistor 13 is connected to the terminal 14. The semiconductor laser 15 is connected between the terminal 14 and the ground.

The inverter circuit IV2 is connected to the gate of the transistor 82 and to the gate of the transistor 9 through the capacitor 21 acting as the filter. The substrate and source of the transistor 9 are connected to the power supply Vcc. Additionally, the power supply Vcc has the resistor 81 and the substrate and source of the transistor 82 connected thereto.

With this configuration, a back gate current (a noise component caused by the parasitic capacity Cdg present between the gate and drain of the transistor 9) that may occur in the transistor 9 upon switching can be canceled by a correction current (a correction pulse that is a noise component with a reverse phase) generated by the capacitor 21. This prevents unwanted noise to in turn prevent large noise components from being superposed on the drive current $I_{LD}$.

Additionally, the transistor 82 and the resistor 81 connected in parallel therewith restrains a switching current Ibg from the back gate of the transistor 13 that occurs when the transistor 13 is switched. That is, the resistor 81 is inserted between the back gate of the transistor 13 and the power supply Vcc. This restrains a very rapid switching current Ibg from the back gate of the transistor 13. If, however, the resistor 81 is inserted, the back gate voltage varies depending on a switching pulse train. To correct this, when the transistor 13 is off, the transistor 82 is turned on to reset a back gate voltage to the power supply Vcc. This prevents the switching current Ibg from being added to the drive current $I_{LD}$ to substantially reduce an overshoot that may occur in the drive current $I_{LD}$.

Moreover, when the transistor 13 is off, its back gate is fixed to the potential of the power supply Vcc. Thus, a laser drive circuit can be realized which is subjected to no variations in pulse train period and which operates accurately at a high speed.

Fifth Embodiment

Figure 10:
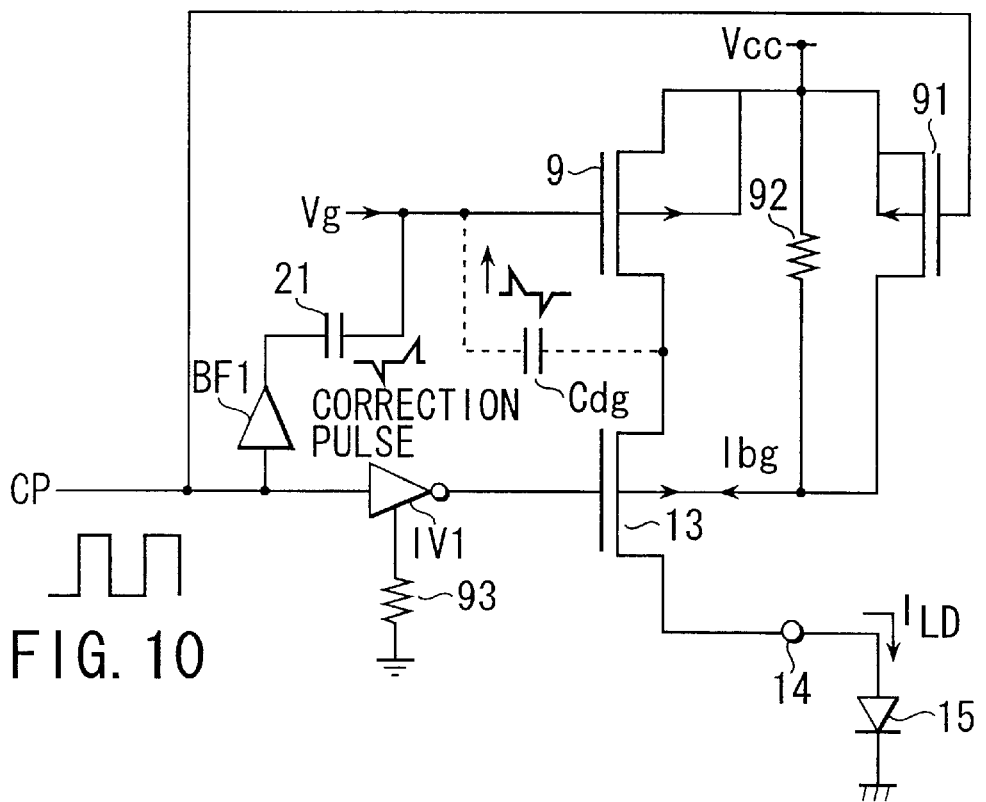
FIG. 10 is a schematic diagram showing the configuration of an integral part of the laser drive circuit shown in FIG. 9.
Figure 9:
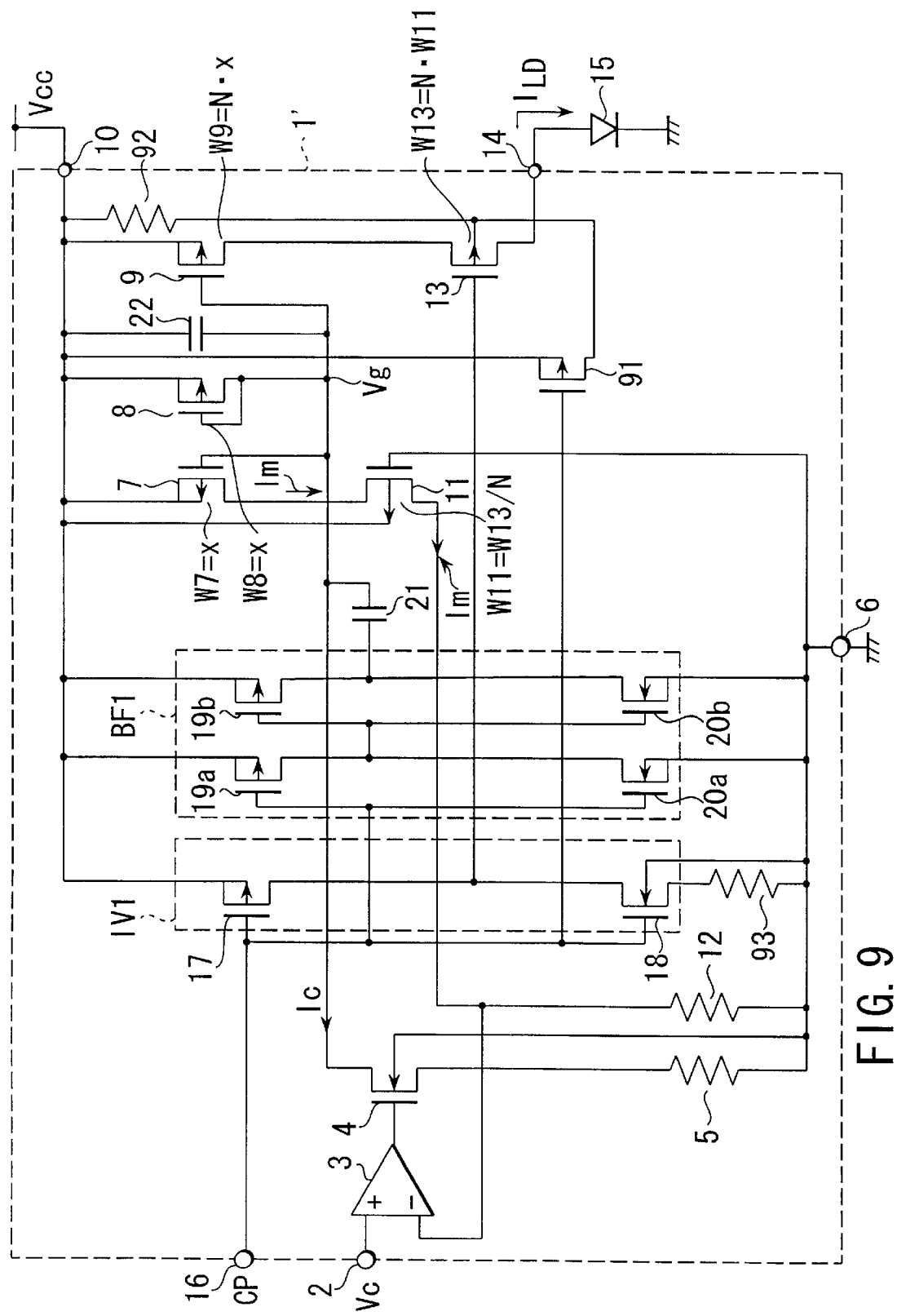
FIG. 9 is a circuit diagram showing an example of a laser drive circuit according to a fifth embodiment of the present invention.

FIG. 9 shows the configuration of a laser drive circuit according to a fifth embodiment of the present invention. FIG. 10 is a simplified view of the configuration of the laser drive circuit in FIG. 9. In FIG. 9, the setting voltage Vc for setting the drive current $I_{LD}$ is supplied to the terminal 2 of this laser drive circuit 1'. A terminal 16 is supplied with a drive pulse signal CP. In addition, the terminal 2 is connected to the non-inverted input end of the OP amplifier 3. The output end of the OP amplifier 3 is connected to the gate of the N-channel MOS transistor 4. The source of the transistor 4 is connected to the grounded terminal 6 through the resistor 5. Additionally, the terminal 6 has the substrate of the transistor 4 connected thereto.

The drain of the transistor 4 has the gate of each of the P-channel MOS transistors 7, 8, and 9 connected thereto. The sources and substrates of these transistors 7, 8, and 9 are connected to the terminal 10 for which the power supply Vcc is provided. In addition, the drain of the transistor 7 is connected to the source of the P-channel MOS transistor 11. The substrate of the transistor 11 is connected to the terminal 10. The gate of the transistor 11 is connected to the terminal 6. Further, the drain of the transistor 11 is connected to the inverted input end of the OP amplifier 3 and to the terminal 6 through the resistor 12.

Additionally, the drain of the transistor 8 is connected to the gate of the transistor 8. Further, the drain of the transistor 9 acting as the drive current source is connected to the source of the P-channel MOS transistor 13 acting as the current switch. The substrate of the transistor 13 is connected to a drain of a P-channel MOS transistor 91 and to the terminal 10 through a resistor 92. In addition, the drain of the transistor 13 is connected to the terminal 14. The semiconductor laser 15 is connected between the terminal 14 and the ground.

On the other hand, the terminal 16 has a gate of the transistor 91 connected thereto. The source and substrate of the transistor 91 are connected to the terminal 10.

The terminal 16 also has connected thereto the gate of each of the P-channel MOS transistor 17 and the N-channel MOS transistor 18 which constitute the inverter circuit IV1. The source and substrate of the transistor 17 are connected to the terminal 10. The transistor 18 has its substrate connected to the terminal 6 and its source connected to the terminal 6 through the resistor 93. The drains of the transistors 17 and 18 which are connected together are connected to the gate of the transistor 13.

Further, the terminal 16 has connected thereto a gate of each of a P-channel MOS transistor 19a and an N-channel MOS transistor 20a which constitute a buffer circuit (a non-inverter circuit) BF1. The source and substrate of the transistor 19a are connected to the terminal 10. The source and substrate of the transistor 20a are connected to the terminal 6. Drains of the transistors 19a and 20a which are connected together are connected to a gate of each of a P-channel MOS transistor 19b and an N-channel MOS transistor 20b which constitute the buffer circuit BF1. The source and substrate of the transistor 19b are connected to the terminal 10. The source and substrate of the transistor 20b are connected to the terminal 6. The drains of the transistors 19b and 20b which are connected together are connected to the gate of each of the transistors 7, 8, and 9 through the capacitor 21 acting as the filter. Additionally, the capacitor 22 constituting the filter is connected between the gate and source of the transistor 9.

The P-channel MOS transistors 7 and 8 have gate widths W7 and W8 each set equal to x (W7=W8=x). The gate width W9 of the P-channel MOS transistor 9 is set N times as large as those W7 and W8 of the transistors 7 and 8 (W9=N·x). In addition, the gate width W11 of the P-channel MOS transistor 11 is set equal to one-N-th of that W13 of the transistor 13 (W11=W13/N, W13=N·W11). The transistors 7, 8, 9, 11, and 13 have an equal gate length.

The operation of the laser drive circuit 1' configured as described above will be explained. The setting voltage Vc is supplied to the non-inverted input end of the OP amplifier 3 through the terminal 2. An output signal from the OP amplifier 3 controls the gate of the transistor 4. Thus, the setting current Ic flowing through the drain of the transistor 4 is controlled. The setting current Ic is supplied to the gate and drain of the transistor 8. A control voltage Vg for the transistor 8 controls a gate voltage of the transistor 9. Thus, the transistor 9 generates the drive current $I_{LD}$. The gate width W9 of the transistor 9 is set N times as large as that W8 of the transistor 8, as described above. Accordingly, a high drive current $I_{LD}$ can be generated with a low setting current Ic.

The control voltage vg for the transistor 8 is also supplied to the gate of the transistor 7. The gate widths W7 and W8 of the transistors 7 and 8 are set equal. Thus, the transistor 7 generates the monitor current Im almost equal to the setting current Ic. The monitor current Im is supplied to the source of the transistor 11. The transistor 11 has its gate grounded and is thus constantly on. As a result, the monitor current Im is feedback to the resistor 12 through the drain of the transistor 11. If the resistor 12 is assumed to have a resistance value Rm, the monitor current Im is expressed by:

$$Im=Vc/Rm=Ic$$

On the other hand, the gate width W11 of the P-channel MOS transistor 11 is set equal to one-N-th of that W13 of the transistor 13 as described above. Thus, a monitor current generating path comprising the transistors 7 and 8 and other components is similar to a drive output path comprising the transistor 13 and other components. As a result, the non-linearity of the drive current $I_{LD}$ with respect to the setting current Ic and the temperature characteristic of the drive current $I_{LD}$ are reflected in the monitor current Im. Therefore, the drive current $I_{LD}$ is corrected by the OP amplifier 3 to be constantly proportional to the setting voltage Vc.

Additionally, the drive pulse signal CP supplied to the terminal 16 is supplied to the input end of the inverter circuit IV1 comprising the transistors 17 and 18. The drive pulse signal CP having its level inverted by the inverter circuit IV1 is supplied to the gate of the transistor 13. Thus, the transistor 13 is turned on when the drive pulse signal CP is at the high level. Consequently, the drive current $I_{LD}$ generated by the transistor 9 is supplied to the semiconductor laser 15. Alternatively, the transistor 13 is turned off when the drive pulse signal CP is at the low level. This cuts off the supply of the drive current $I_{LD}$ to the semiconductor laser 15. Thus, the drive current $I_{LD}$ generated by the transistor 9 is eliminated to reduce current consumption.

Next, a method will be described which restrains the switching current Ibg from the back gate of the P-channel MOS transistor 13 acting as the current switch, the current possibly occurring when this transistor 13 is switched. In FIG. 10, the capacitor 21 generates the correction current (the correction pulse that is a noise component with an opposite phase) from the output signal from the buffer circuit BF1. This correction current is supplied to the gate of the transistor 9 to prevent an unwanted noise. The buffer circuit BF1 is provided in order to adjust the timing at which the correction current for canceling the back gate current of the transistor 9, which is generated when the transistor 13 is switched, is supplied to the gate of the transistor 9.

In addition, the switching current Ibg from the back gate of the transistor 13 can be restrained by the resistor 92 inserted between the substrate of the transistor 13 and the power supply Vcc. In this case, the insertion of the resistor 92 varies the back gate voltage depending on the switching pulse train. The variation of the back gate voltage is eliminated by turning on the transistor 91 located in parallel with the resistor 92 to reset the back gate voltage to the power supply Vcc.

Furthermore, the switching current Ibg from the back gate of the transistor 13 can be restrained by the resistor 93 inserted between the inverter circuit IV1 and the ground. That is, the switching current Ibg can be suppressed by using a time constant between the resistor 93 and a gate parasitic capacity to delay rising of a gate voltage when the transistor 13 is turned on.

This configuration prevents the switching current Ibg from being added to the drive current $I_{LD}$, thereby substantially diminishing a possible overshoot in the drive current $I_{LD}$. Moreover, when the transistor 13 is off, its back gate voltage is fixed to the potential of the power supply Vcc. Thus, a laser drive circuit can be realized which is subjected to no variations in pulse train period and which operates accurately at a high speed.

Sixth Embodiment

Figure 11:
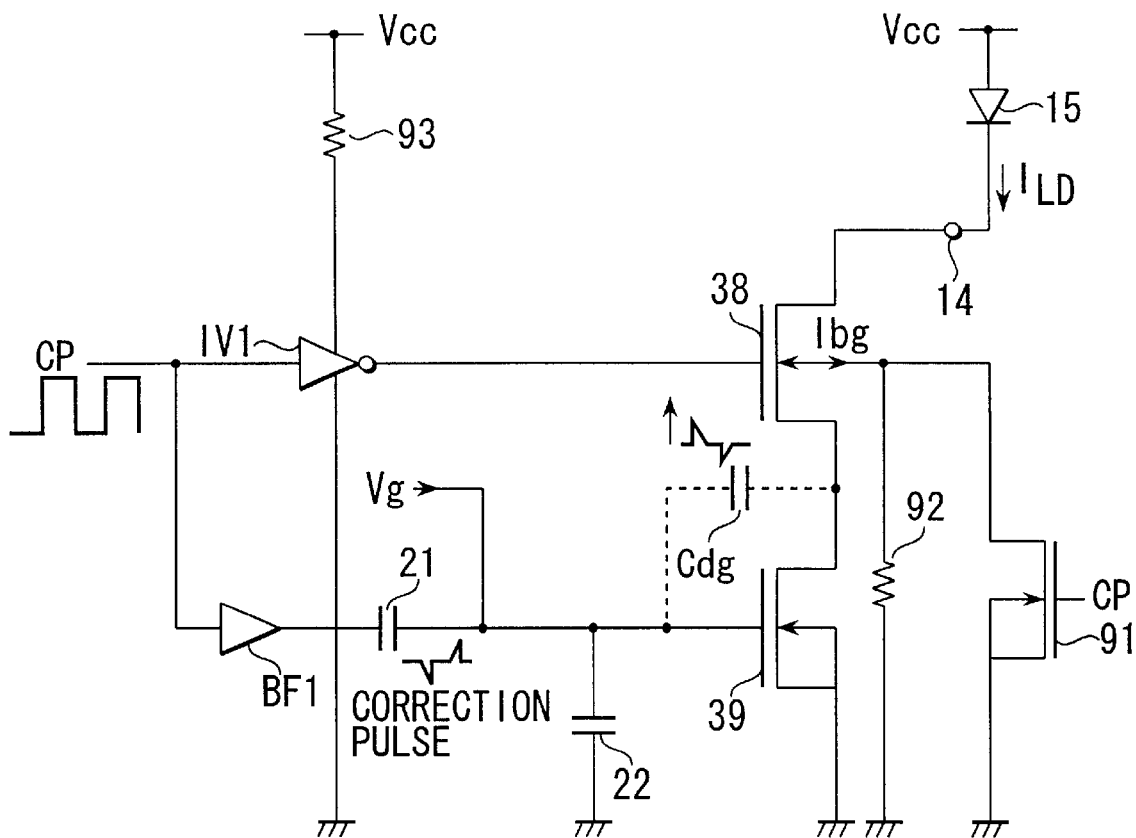
FIG. 11 is a schematic diagram showing the configuration of an integral part of a laser drive circuit according to a sixth embodiment of the present invention.

FIG. 11 is a simplified view showing the configuration of a laser drive circuit according to a sixth embodiment of the present invention. In this example, the laser drive circuit 1 shown in the above described FIG. 5 and comprising the semiconductor laser 15 driven by the N-channel MOS transistors 38 and 39 is configured so as to suppress the switching current Ibg from the back gate of the N-channel MOS transistor 38 acting as the current switch, the current possibly occurring when this transistor 38 is switched.

In this case, as shown in FIG. 11, the inverter circuit IV1 to which the drive pulse signal CP is supplied is connected to the gate of the N-channel MOS transistor 38 acting as the current switch. The source of the transistor 38 is connected to the drain of the N-channel MOS transistor 39 acting as the drive current source. In addition, the drain of the transistor 38 is connected to the terminal 14. The semiconductor laser 15 is connected between the terminal 14 and the power supply Vcc.

The substrate of the transistor 38 is connected to the drain of the N-channel MOS transistor 91 and to the grounded resistor 92. The drive pulse signal CP is supplied to the gate of the transistor 91. The substrate and source of the transistor 91 are grounded.

In addition, the buffer circuit BF1 to which the drive pulse signal CP is supplied is connected to the gate of the transistor 39 through the capacitor 21 acting as the filter. The substrate and source of the transistor 39 are grounded. In addition, the capacitor 22 constituting the filter is connected between the gate and source (ground) of the transistor 39.

Further, the resistor 93 is inserted between the inverter circuit IV1 and the power supply Vcc.

This configuration enables the semiconductor laser 15 to be driven by the N-channel MOS transistors 38 and 39 and restrains the switching current Ibg from the back gate of the N-channel MOS transistor 38 acting as the current switch, the current possibly occurring when this transistor 38 is switched.

The present invention is not limited to the above described embodiments but may be varied without deviating from the spirit thereof when implemented. Furthermore, each of the above described embodiments includes inventions at various levels, so that various inventions can be extracted by combining the plurality of disclosed configuration requirements as appropriate. For example, if some of the configuration requirements shown in each embodiment are deleted, the configuration with these requirements deleted can be extracted only if the problems described in the "Problems to Be Solved by the Invention" can be solved and if the effects described in the "Effects of the Invention" are obtained.

As described above, the present invention can provide a laser drive circuit that requires less current consumption and that can operate at a high speed, as well as a recording apparatus using this laser drive circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser drive circuit comprising:
a drive current source comprising a first MOS transistor to generate a drive current depending on a setting current;
a switch comprising a second MOS transistor to supply the drive current generated by said drive current source to a semiconductor laser in response to a drive signal;
a first inverter circuit which inverts a level of the drive signal, the first inverter circuit being connected to a gate of the second MOS transistor composing the switch; and
a first capacitor which stabilizes the drive current when the switch is turned on or off, the first capacitor being connected to a gate of the first MOS transistor composing the drive current source, wherein said drive current is cutoff when not supplied to the semiconductor laser through the switch.

2. A laser drive circuit according to claim 1, comprising a control circuit configured to detect said setting current and to control the setting current depending on a setting voltage.

3. A laser drive circuit according to claim 1, further comprising a second inverter circuit configured to invert a level of an output signal from the first inverter circuit, the second inverter circuit being connected to the first capacitor.

4. A laser drive circuit according to claim 3, wherein the first capacitor generates a correction current from an output signal of said second inverter circuit.

5. A laser drive circuit according to claim 1, further comprising a first non-inverter circuit configured to non-invert a level of said drive signal, the first non-inverter circuit being connected to the first capacitor.

6. A laser drive circuit according to claim 5, wherein said first capacitor generates a correction current from an output signal of said non-inverter circuit.

7. A laser drive circuit according to claim 5, wherein said second MOS transistor comprises a P-channel MOS transistor, and a resistor is provided between the first inverter circuit and a ground connection.

8. A laser drive circuit according to claim 5, wherein said second MOS transistor comprises an N-channel MOS transistor, and a resistor is provided between the first inverter circuit and a power source.

9. A laser drive circuit according to claim 1, further comprising a second capacitor connected between a gate and source of the first MOS transistor composing said drive current source.

10. A laser drive circuit according to claim 1, further comprising a restrain circuit configured to restrain a noise current of said switch.

11. A laser drive circuit according to claim 10, wherein said restrain circuit comprises a resistor connected to a substrate of the second MOS transistor composing said switch.

12. A recording apparatus comprising:
   a drive circuit configured to generate a drive current for recording depending on a setting voltage for recording; and
   a semiconductor laser to which the drive current from the drive circuit is supplied,
   said drive circuit comprising:
      a drive current source comprising a first MOS transistor to generate the drive current depending on a setting current corresponding to the setting voltage;
      a switch comprising a second MOS transistor to supply said drive current generated by said drive current source to said semiconductor laser in response to a drive signal;
      a first inverter circuit configured to invert a level of the drive signal, the first inverter circuit being connected to a gate of the second MOS transistor composing the switch; and
      a first capacitor configured to stabilize the drive current when the switch is turned on or off, the first capacitor being connected to a gate of the first MOS transistor composing the drive current source wherein the drive circuit is cutoff when not supplied to the semiconductor laser through the switch.

13. A recording apparatus according to claim 12, wherein said drive circuit further comprises a control circuit configured to detect said setting current to control the setting current depending on said setting voltage.

14. A recording apparatus according to claim 12, further comprising a second inverter circuit configured to invert a level of an output signal from the first inverter circuit, the second inverter circuit being connected to the first capacitor.

15. A recording apparatus according to claim 14, wherein the first capacitor generates a correction current from an output signal of said second inverter circuit.

16. A recording apparatus circuit according to claim 12, further comprising a first non-inverter circuit configured to non-invert a level of said drive signal, the first non-inverter circuit being connected to the first capacitor.

17. A recording apparatus according to claim 16, wherein said first capacitor generates a correction current from an output signal of said first non-inverter circuit.

18. A recording apparatus according to claim 16, wherein said second MOS transistor comprises a P-channel MOS transistor, and a resistor is provided between the first inverter circuit and a ground connection.

19. A recording apparatus according to claim 16, wherein said second MOS transistor comprises an N-channel MOS transistor, and a resistor is provided between the first inverter circuit and a power source.

20. A recording apparatus according to claim 12, further comprising a second capacitor connected between a gate and source of the first MOS transistor composing said drive current source.

21. A recording apparatus according to claim 12, further comprising a restrain circuit configured to restrain a noise current from said switch.

22. A recording apparatus according to claim 21, wherein said restrain circuit comprises a resistor connected to a substrate of the second MOS transistor composing said switch.

* * * * *